(12) United States Patent
Nakahama

(10) Patent No.: US 8,390,115 B2
(45) Date of Patent: Mar. 5, 2013

(54) WIRING BOARD AND SEMICONDUCTOR DEVICE USING THE WIRING BOARD

(75) Inventor: Hiroki Nakahama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 186 days.

(21) Appl. No.: 12/866,921

(22) PCT Filed: Mar. 6, 2009

(86) PCT No.: PCT/JP2009/054276
§ 371 (c)(1),
(2), (4) Date: Aug. 10, 2010

(87) PCT Pub. No.: WO2009/122854
PCT Pub. Date: Oct. 8, 2009

(65) Prior Publication Data
US 2010/0327437 A1 Dec. 30, 2010

(30) Foreign Application Priority Data
Apr. 3, 2008 (JP) .................................. 2008-096817

(51) Int. Cl.
*H01L 23/48* (2006.01)
(52) U.S. Cl. ........ 257/737; 257/759; 257/779; 257/781; 257/E23.015
(58) Field of Classification Search .................. 257/737, 257/759, 779, 781
See application file for complete search history.

(56) References Cited

U.S. PATENT DOCUMENTS

| 6,981,317 | B1 * | 1/2006 | Nishida ........................... 29/840 |
| 2002/0050397 | A1 | 5/2002 | Sakamoto et al. |
| 2005/0091844 | A1 * | 5/2005 | Sathe et al. ..................... 29/832 |
| 2007/0132099 | A1 * | 6/2007 | Hashimoto .................... 257/737 |

FOREIGN PATENT DOCUMENTS

| CN | 1351376 A | 5/2002 |
| JP | 10-341068 A | 12/1998 |
| JP | 2000-299330 A | 10/2000 |
| JP | 2004-193277 A | 7/2004 |
| JP | 2005-101659 A | 4/2005 |

* cited by examiner

*Primary Examiner* — Wai Sing Louie
(74) *Attorney, Agent, or Firm* — Birch, Stewart, Kolasch & Birch, LLP

(57) ABSTRACT

Provided is a wiring board wherein a circuit is not short-circuited when a IC chip is mounted on the wiring board. A wiring board (2) is provided with a substrate (4); wiring layers (5-8), which are formed on a surface of the substrate (4) and have prescribed wiring patterns; connecting terminals (9-12), which are formed on a part of the wiring layers (5-8) and electrically connected with bumps (18-21) of an integrated circuit chip (IC chip) (3); a mounting region (14), which is arranged on the surface of the substrate (4) and has the integrated circuit chip (3) mounted therein; and an insulating layer (13), which is formed on the surface of the substrate (4) so as to surround the circumference of the mounting region (14) for protecting wiring layers (5-8). A part of the insulating layer (3) is arranged inside the mounting region (14), and the thickness of the insulating layer (13) is more than that of the bumps (18-21) of the integrated circuit chip (3).

13 Claims, 5 Drawing Sheets

WIRING BOARD AND SEMICONDUCTOR DEVICE USING THE WIRING BOARD

TECHNICAL FIELD

The present invention relates to a wiring board and a semiconductor device that uses the wiring board.

BACKGROUND ART

In recent years, along with size and thickness reductions of an electronic device, thickness reduction of a wiring board mounted in an electronic device is required. There is a flexible printed wiring board as an example of such a wiring board. Because a flexible printed wiring board has flexibility, it is possible to considerably deform the flexible printed wiring board; and even in a case where a space in an electronic device becomes small because of size and thickness reductions of the electronic device, it becomes possible to mount components in the small space.

A semiconductor device including a wiring board which is the above conventional example is shown in FIG. 7. FIG. 7 is a top view showing the semiconductor device as the conventional example. With reference to FIG. 7, in the semiconductor device 100 as the conventional example, an integrated circuit chip 102 (hereinafter, described as an IC chip), and discrete components 103a-103i such as a capacitor, a transistor, a diode and the like are mounted on a wiring board 101.

Here, FIG. 8 shows an enlarged top view of a portion where the IC chip is placed in the semiconductor device as the conventional example. Besides, FIG. 9 shows a sectional view along a G-H line in FIG. 8. As shown in FIG. 8, the wiring board 101 includes a substrate 111. On the substrate 111, wiring layers 105-108 that have predetermined wiring patterns are formed. The wiring layers 105-108 are extended inside a mount region where the IC chip 102 is mounted; and a solder resist 109 that protects the wiring layers 105-108 is formed around the mount region. Because of this, part of the wiring layers 105-108 are in a state to be exposed in the mount region where the IC chip 102 is mounted. Besides, on the substrate 111, the IC chip 102 is so placed as to cover the exposed part of the wiring layers 105-108. And, a bump electrode 110 (see FIG. 9) disposed on a lower surface of the IC chip 102 is joined to the wiring layers 105-108, so that the wiring board 101 and the IC chip 102 are electrically connected to each other. Specifically, as shown in FIG. 9, the wiring layers 105a and 107a come into contact with the bump electrodes 110a and 110b, respectively, so that the wiring board 101 and the IC chip 102 are electrically connected to each other.
Patent document 1: JP-A-2004-193277

DISCLOSURE OF THE INVENTION

Problems to be Solved by the Invention

In such a semiconductor device, in joining the bump electrode 110 disposed on the IC chip 102 and the wiring layers 105-108 of the wiring board 101 to each other, the IC chip 102 and the wiring board 101 are pressed. Because of this, the substrate 111 bends because of the pressure applied to the wiring board 101, so that the wiring layers 105-108 disposed on the substrate 11 sink. Besides, in many joining techniques, because heat is also applied at the same time of application of pressure, the substrate 111 bends more and the wiring layers 105-108 sink more.

FIG. 10 is a sectional view showing a state in which the substrate bends in the wiring board as the conventional example. As shown in FIG. 10, to join the bumps 110a and 110b and the wiring layers 105a and 107b to each other, respectively, if IC chip 102 and the wiring board 101 are pressed, the pressed region of the wiring board 101 sinks downward and at the same time, the surrounding region swells upward. Because of this, part of the wiring board 101 comes close to the IC chip 102, which raises a disadvantage in which at a side edge portion (portion within a circle R in FIG. 10), the IC chip 102 and the wiring layers 105-108 come into contact with each other. In this way, the IC chip 102 and the wiring layers 105a, 107a electrically short to each other; and the circuit shorts. As a result of this, the wiring board 101 becomes unable to operate normally, there is a problem that the semiconductor device becomes defective.

The present invention has been made to solve the above problems, and it is an object of the present invention to provide: a wiring board in which a circuit does not short in mounting an IC chip; and a semiconductor device that uses the wiring board.

Means for Solving the Problem

To achieve the object, a wiring board according to the present invention includes: a substrate; a wiring layer that is formed on a surface of the substrate and has a predetermined wiring pattern; a connection terminal that is formed on part of the wiring layer and electrically connected to a bump electrode of a integrated circuit chip; a mount region that is disposed on the surface of the substrate and where the integrated circuit chip is mounted; and an insulation layer that protects the wiring layer which is so formed on the surface of the substrate as to surround a circumference of the mount region. And, part of the insulation layer is disposed inside the mount region; and a thickness of the insulation layer is larger than a thickness of the bump electrode of the integrated circuit chip. Here, in the present invention, the integrated circuit chip mounted on the wiring board is a conception that includes even a chip-like package such as a WLCSP (Wafer Level Chip Size Package) and the like.

According to the above structure, in the wiring board of the present invention, part of the insulation layer is disposed inside the mount region where the integrated circuit chip is mounted. As a result of this, because the insulation layer and the integrated circuit chip come into contact with each other in a time the substrate is sunk by a press process that is used to electrically connect the wiring board and the integrated circuit chip with each other, a gap between the integrated circuit chip and the substrate is secured by the insulation layer that comes into contact with the integrated circuit chip. Besides, the insulation layer and the integrated circuit chip come into contact with each other, so that bending of the substrate is prevented. In this way, because part of the substrate is prevented from coming close to the integrated circuit chip in a time the integrated circuit chip is mounted, contact between the integrated circuit chip and the wiring board is avoided. Accordingly, in the time the integrated circuit chip is mounted, it is possible to prevent a circuit short due to contact between the integrated circuit chip and the wiring board. As a result of this, it is possible to prevent the semiconductor device from becoming defective. Here, according to the above structure, because it becomes possible to prevent a circuit short only by changing a formation pattern of the insulation layer, the production process is prevented from becoming onerous.

In the wiring board having the above structure, preferably, the insulation layer disposed inside the mount region is formed away from the connection terminal and the wiring layer. According to this structure, even if the structure, in which the insulation layer is disposed in the mount region, is employed, it is possible to electrically connect the bump electrode of the integrated circuit chip and the wiring layer to each other without being obstructed by the insulation layer.

In the wiring board having the above structure, preferably, the mount region has substantially a rectangular shape when seen in a planar fashion and the insulation layer disposed inside the mount region is disposed on at least one of the four corners of the mount region. According to this structure, although part of the four side edges of the integrated circuit chip and the wiring layer are likely to come into contact with each other in the press process, it is possible to easily avoid contact between each side edge of the integrated circuit chip and the wiring layer by disposing the insulation layer on at least one of the four corners of the mount region. In this way, because it is possible to surely prevent the circuit from electrically shorting, it is possible to surely prevent the semiconductor device from becoming defective.

In this case, preferably, the insulation layer disposed inside the mount region is disposed on the four corners of the mount region. According to this structure, because it is possible to more surely prevent the circuit from electrically shorting, it is possible to more surely prevent the semiconductor device from becoming defective.

In the wiring board having the above structure, the wiring layer is disposed on both surfaces of the substrate. According to this structure, the mount region increases and it is possible to achieve a wiring board which deals with the size reduction. Incidentally, in disposing the wiring layer on both surfaces of the substrate, a cover lay film for protecting the wiring layer disposed on the lower surface of the substrate is laminated. The cover lay film includes an adhesive layer for joining the wiring layer and a protection layer that includes a polyimide film and the like; the protection layer is excellent in flexibility but has low in elastic modulus. Because of this, a distance by which the wiring layer disposed on the substrate sinks increases by a thickness of the cover lay film. In this way, the distance between the wiring board and the integrated circuit chip becomes shorter and the integrated circuit chip and the wiring layer become more likely to come into contact with each other. However, as in the present invention, by disposing the part of the insulation layer inside the mount region, it is possible to avoid contact between the integrated circuit chip and the wiring layer even if the sinking distance of the wiring layer increases. Because of this, also in the wiring board on both surfaces of which the wiring layer is disposed, because it is possible to prevent occurrence of a circuit short in the time the integrated circuit chip is mounted, it is possible to prevent the semiconductor device from becoming defective.

In the wiring board having the above structure, preferably, the substrate includes a polyimide film or a polyethylene terephtalate film. According to this structure, it is possible to obtain a flexible printed substrate that has flexibility and is able to be bent. Incidentally, a material that is excellent in flexibility is often low in elastic modulus and has a characteristic that the substrate is easily sunk by press. However, by using the wiring board according to the present invention, it is possible to achieve a wiring board that deals with the size and thickness reductions of the semiconductor device and prevents a circuit short.

To achieve the above object, a semiconductor device according to the present invention includes the above wiring board. According to this structure, it is possible to obtain a semiconductor device in which a circuit short is prevented.

Advantages of the Invention

As described above, according to the present invention, it is possible to easily obtain a wiring board in which a circuit does not short in a time an integrated circuit chip is mounted and a semiconductor device that uses the wiring board.

LIST OF REFERENCE SYMBOLS 2 wiring board
3 integrated circuit chip (IC chip)
4 substrate
5(5a-5g), 6(6a-6g), 7(7a-7g), 8(8a-8g), 22 wiring layers
9(9a-9g), 10(10a-10g), 11(11a-11g), 12(12a-12g) connection terminals
13 insulation layer
14 mount region
18(18a-18g), 19(19a-19g), 20(20a-20g), 21(21a-21g) bumps (bump electrodes)

BEST MODE FOR CARRYING OUT THE INVENTION

Hereinafter, an embodiment that embodies the present invention is descried in detail based on the drawings.

Figure 1:
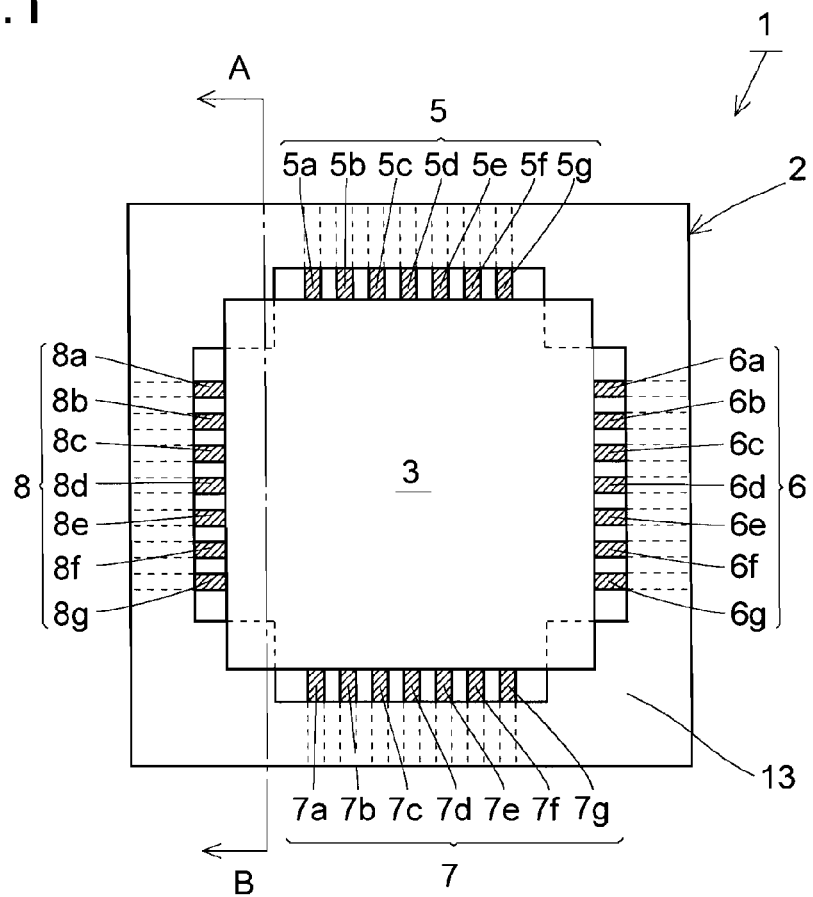
FIG. 1 is an enlarged top view showing part of a semiconductor device according to an embodiment of the present invention.
Figure 2:
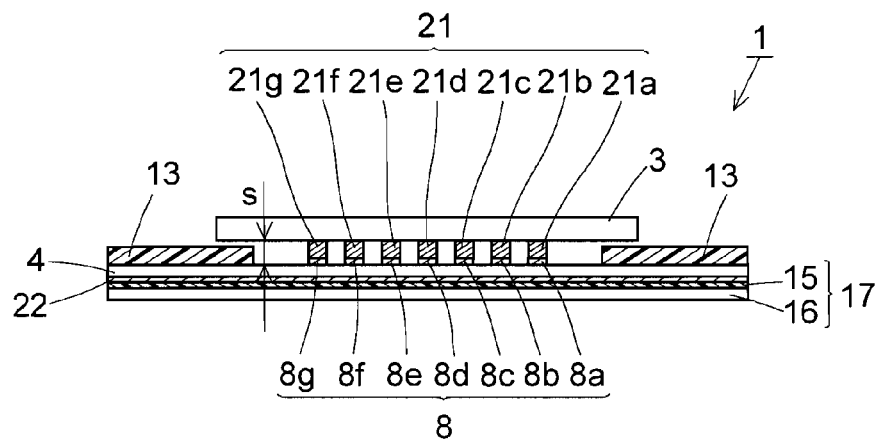
FIG. 2 is a sectional view along an A-B line in FIG. 1.
Figure 3:
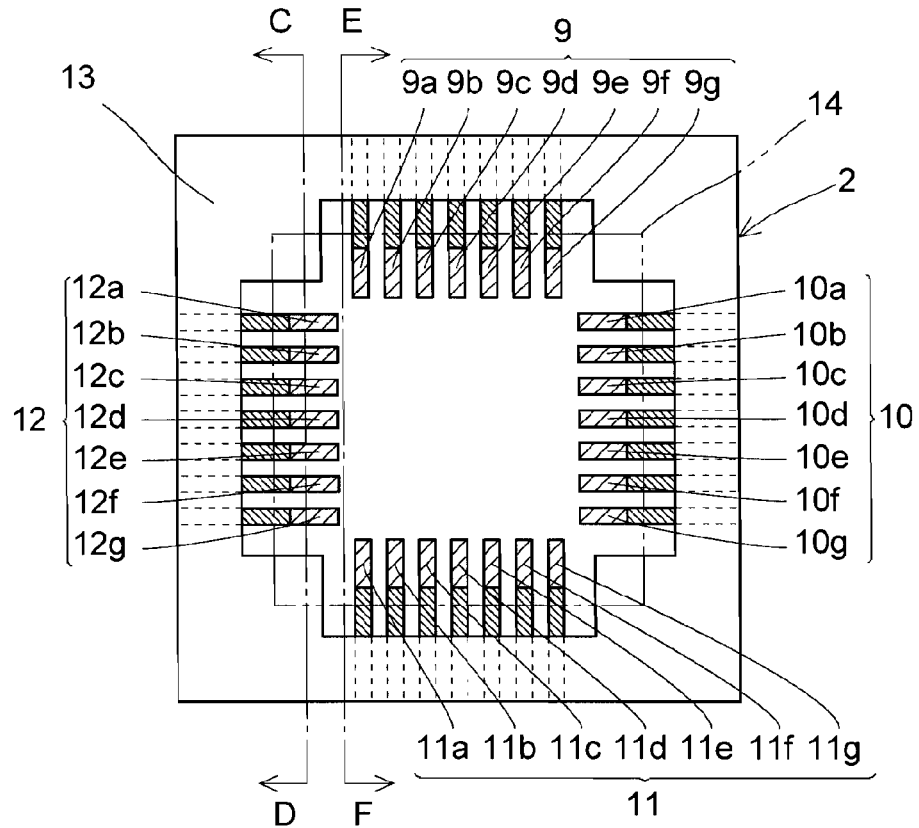
FIG. 3 is an enlarged top view showing part of a wiring board according to an embodiment of the present invention.
Figure 4:
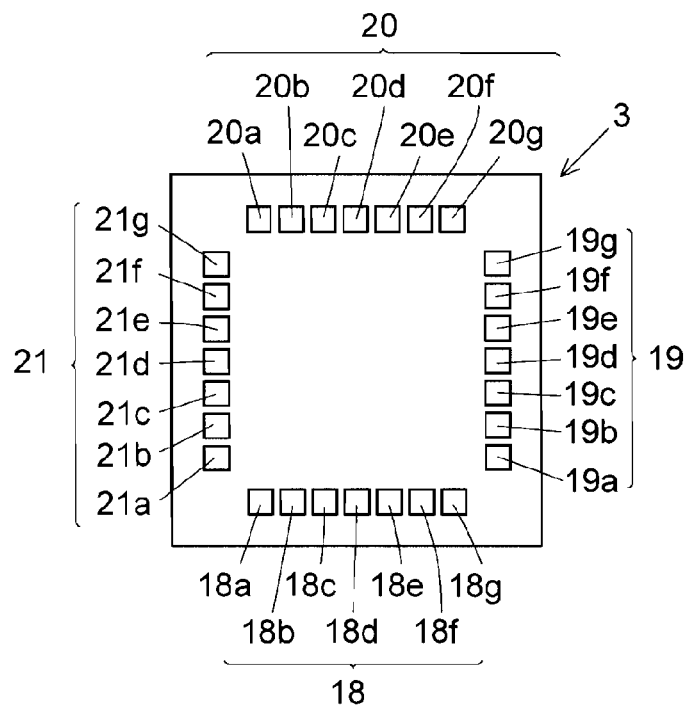
FIG. 4 is a bottom view of an IC chip mounted on a wiring board according to an embodiment of the present invention.

FIG. 1 is an enlarged top view showing part of a semiconductor device according to an embodiment of the present invention. FIG. 2 is a sectional view along a A-B line in FIG. 1. FIG. 3 is an enlarged top view showing part of a wiring board according to an embodiment of the present invention. FIG. 4 is a bottom view of an IC chip mounted on a wiring board according to an embodiment of the present invention. Here, FIG. 1 shows an enlarged position where an IC chip is mounted on an upper surface of the wiring board; FIG. 3 shows an enlarged region on which the IC chip is mounted.

As shown in FIG. 1, a semiconductor device 1 according to an embodiment of the present invention includes: a wiring board 2; and an integrated circuit chip 3 (hereinafter, described as an IC chip 3) that is mounted on the wiring board 2. The IC chip (integrated circuit chip) 3 includes a bare chip, for example. Besides, the wiring board 2 has a plurality of wiring layers 5 (5*a*-5*g*), 6 (6*a*-6*g*), 7 (7*a*-7*g*) and 8 (8*a*-8*g*); part of the wiring layers 5-8 are covered by an insulation layer 13.

Here, as for a component that is mounted in the above semiconductor device 1, the IC chip 3 is referred to; however, besides the IC chip 3, a plurality of discrete components such as a capacitor, a transistor (inclusive of a MOSFET), a diode and the like may be mounted in the semiconductor device 1; and the components mounted in the semiconductor device 1 are changed suitably in accordance with a purpose of the semiconductor device 1.

In the wiring board 2 according to an embodiment of the present invention, as shown in FIG. 2, a wiring layer is formed on both surfaces of the substrate 4 that includes a polyimide film or a polyethylene terephtalate (PET) and has flexibility. Specifically, on an upper surface of the substrate 4, the wiring layers 5-8 (see FIG. 1) that each have a predetermined wiring pattern are formed by using a photolithography technology and the like. Besides, on a lower surface of the substrate 4, a wiring layer 22 is formed. The wiring layer 22 is covered by a cover lay film 17 that is used to protect the wiring layer 22. The cover lay film 17 is composed of an adhesive layer 15 and a protection layer 16 that includes a polyimide film and the like. And, on the upper surface of the substrate 4, the insulation layer 13 is so formed as to surround the region on which the IC chip 3 and the like are placed. Besides, part of the wiring layers 5-8 are exposed between the region on which the IC chip 3 is placed and the region where the insulation layer 13 is disposed.

The wiring board 2 according to an embodiment of the present invention includes a flexible printed substrate that has flexibility and is able to be considerably deformed. Because of this, three-dimensional wiring and the like become possible and it is possible to deal with the size and thickness reductions of an electronic apparatus in which the semiconductor device 1 is mounted and to perform the wiring even in a small space.

Here, in the present embodiment, the substrate 4 that has flexibility is described; however, the present invention is not limited to the above substrate 4, and the present invention is suitably applicable to a substrate in which bending occurs because of pressure and heat in the time the IC chip 3 is disposed on the wiring board 2. Because of this, for example, as the substrate, a substrate and the like, which use a thermosetting substrate that is low in elastic modulus or a thermoplastic resin such as a liquid crystal polymer or the like, may be used.

Here, structures of the wiring layers 5-8 in the region on which the IC chip 3 is placed are described in detail below.

On the upper surface of the wiring board 2, as shown in FIGS. 1 and 3, the mount region 14 (see FIG. 3) on which the IC chip 3 is placed (mounted) is disposed. The mount region 14 has substantially a rectangular shape when seen in a planar fashion to correspond to the IC chip 3 (see FIG. 1). The wiring layers 5-8 (see FIG. 1) formed on the upper surface of the substrate 4 are so composed as to correspond to the four side end portions of the mount region 14; and each of the wiring layers 5-8 is so extended inside the mount region as to meet each side end portion at right angles. Besides, the wiring layers 5-8 are each composed of a plurality of wiring layers. Specifically, the wiring layer 5 includes wiring layers 5*a*-5*g*; and the wiring layer 6 includes wiring layers 6*a*-6*g*. Besides, the wiring layer 7 includes wiring layers 7*a*-7*g*; and the wiring layer 8 includes wiring layers 8*a*-8*g*. These wiring layers 5 (5*a*-5*g*), 6 (6*a*-6*g*), 7 (7*a*-7*g*) and 8 (8*a*-8*g*) are disposed a predetermined distance away from each other.

Besides, at end portions that are portions of the wiring layers 5 (5*a*-5*g*), 6 (6*a*-6*g*), 7 (7*a*-7*g*) and 8 (8*a*-8*g*) and are disposed inside the mount region 14, connection terminals 9 (9*a*-9*g*), 10 (10*a*-10*g*), 11 (11*a*-11*g*) and 12 (12*a*-12*g*) are formed respectively. Specifically, at the end portions that are portions of the wiring layers 5*a*-5*g* and are disposed inside the mount region 14, the connection terminals 9*a*-9*g* are formed respectively. At the end portions that are portions of the wiring layers 6*a*-6*g* and are disposed inside the mount region 14, the connection terminals 10*a*-10*g* are formed respectively. At the end portions that are portions of the wiring layers 7*a*-7*g* and are disposed inside the mount region 14, the connection terminals 11*a*-11*g* are formed respectively. At the end portions that are portions of the wiring layers 8*a*-8*g* and are disposed inside the mount region 14, the connection terminals 12*a*-12*g* are formed respectively. Here, the positions of the connection terminals 9-12 are not limited the end portions of the wiring layers 5-8; and the connection terminals 9-12 may be formed on the wiring layers 5-8 disposed inside the mount region 14.

On a surface which is a surface of the IC chip 3 placed (mounted) on the mount substrate 14 and faces the wiring board 2, as shown in FIG. 4, bumps 18 (18*a*-18*g*), 19 (19*a*-19*g*), 20 (20*a*-20*g*) and 21 (21*a*-21*g*) are so disposed as to come into contact with the connection terminals 9 (9*a*-9*g*), 10 (10*a*-10*g*), 11 (11*a*-11*g*) and 12 (12*a*-12*g*) (see FIG. 3) of the wiring board 2, respectively. In this way, for example, as shown in FIG. 2, in a time the press process is performed by means of the ACF (Anisotropic Conductive Film) technique, the NCP (Non Conductive Paste) technique or the like, the bumps 21 (21*a*-21*g*) disposed on the IC chip 3 side and the connection terminals 12 (12*a*-12*g*) disposed at the end portions of the wiring layers 8 (8*a*-8*g*) of the wiring board 2 are joined to each other, so that the IC chip 3 and the wiring board 2 are electrically connected to each other. Here, the bump is a projection-shape electrode formed of a metal of several tens of micrometers; specifically, there is a Au bump, a Cu bump and the like, for example. Besides, the bumps 21 (21*a*-21*g*) are an example of a "bump electrode" in the present invention.

The insulation layer 13 surrounds the circumference of the mount region 14 and part of the insulation layer 13 is disposed inside the mount region 14. Specifically, as shown in FIG. 3, the part of the insulation layer 13 is formed on the regions at the four corners of the mount region 14. These region are regions where the wiring layers 5-8 are not formed; and the part of the insulation layer 13 is formed on the four corners of the mount region 14, so that the insulation layer 13 disposed inside the mount region 14 is in a state to be away from the wiring layers 5-8 and the connection terminals 9-12. Here, the insulation layer 13 is composed of a solder resist and the like.

Here, the thicknesses of the connection terminals 9-12 (wiring layers 5-8) are each about 15 μm to about 20 μm; and the thicknesses of the bumps 18-21 formed on the IC chip 3 are each about 12 μm to 17 μm. On the other hand, the thickness of the insulation layer 13 is about 25 μm. Because of this, the thickness of the insulation layer 13 is smaller than the sum thickness s (see FIG. 2) of the thickness of the connection terminal (wiring layer) and the thickness of the bump. According to this, in the time the IC chip 3 is placed (mounted) on the upper surface of the wiring board 2, it becomes possible to dispose the part of the insulation layer 13 disposed inside the mount region 14 on the lower surface of the IC chip 13.

Besides, as described above, inside the mount region 14, the positions where the connection terminals 9-12 and the wiring layers 5-8 are formed and the position where the insulation layer 13 is disposed are away from each other.

Because of this, the insulation layer 13 is not laminated over the connection terminals 9-12 and the wiring layers 5-8. According to this, even if the part of the insulation layer 13 is disposed inside the mount region 14, it is possible to easily join the bumps 18-21 and the connection terminals 9-12 to each other by means of the press process without being obstructed by the thickness of the insulation layer 13. In this way, it is possible to easily achieve the wiring board 2 that prevents a circuit short.

Here, in the present embodiment, the insulation layer 13 is disposed on all the four corners of the mount region 14; however, a structure may employed, in which the insulation layer 13 is disposed on at least one of the four corners of the mount region 14. Besides, in addition to the above structure, a structure may be employed, in which inside the mount region 14, the insulation layer 13 is disposed between the adjacent wiring layers 5-8 or between the adjacent connection terminals 9-12. In this case, because the insulation layer 13 is disposed on each side edge of the mount region besides the corners of the mount region 14, it is possible to more surely make the insulation layer 13 and the IC chip 3 come into contact with each other. In this way, it is possible to prevent a circuit short between the wiring board 2 and the IC chip 3. Here, it is preferable that the pitch (interval) of the wiring layers 5-8 and the pitch (interval) of the connection terminals 9-12 are long enough to allow the insulation layer 13 to be formed.

Figure 5:
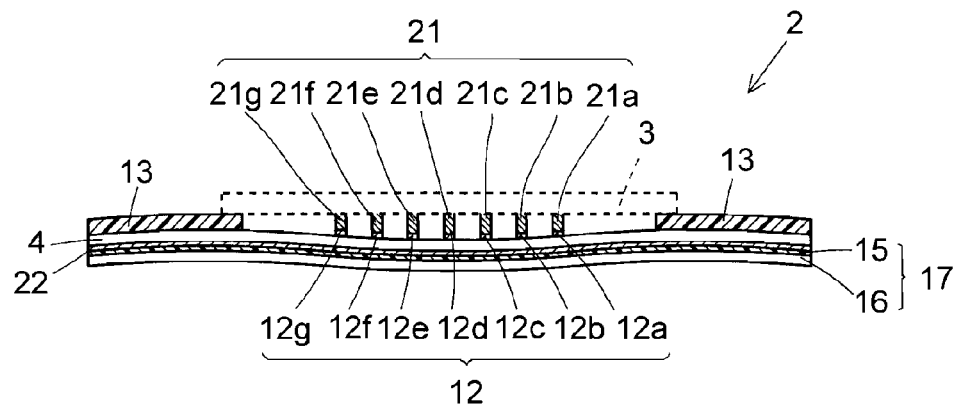
FIG. 5 is a sectional view along a C-D line in FIG. 3.
Figure 6:
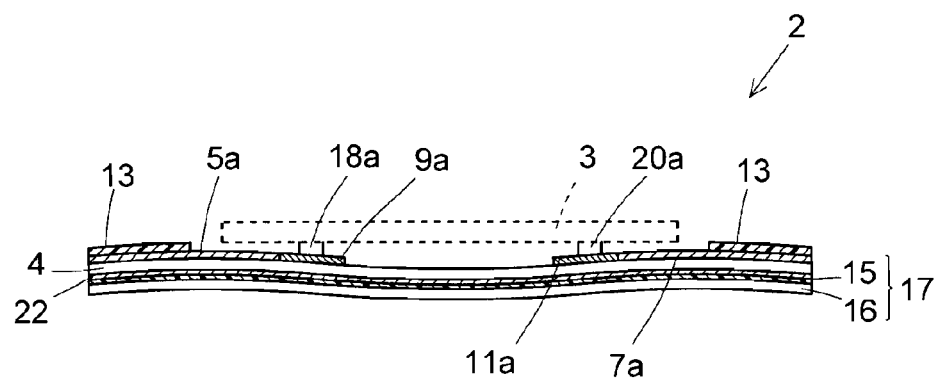
FIG. 6 is a sectional view along an E-F line in FIG. 3.
Figure 7:
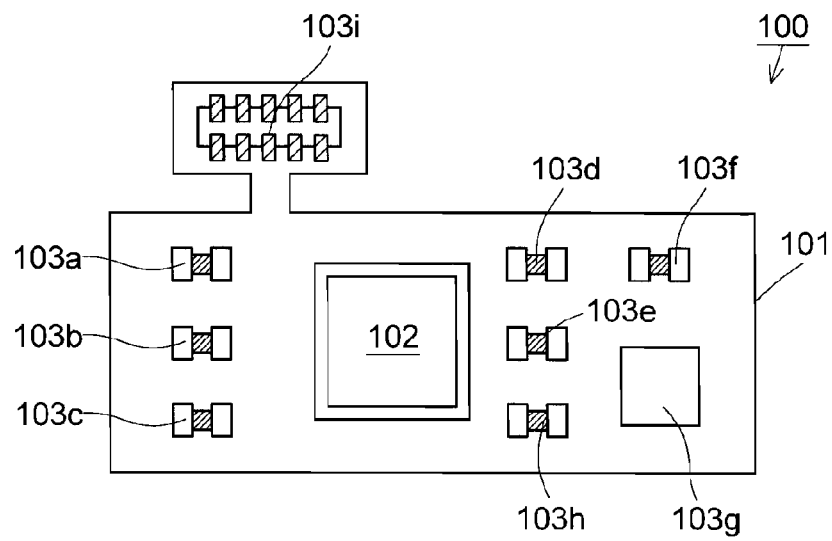
FIG. 7 is a top view showing a semiconductor device according to a conventional example.
Figure 8:
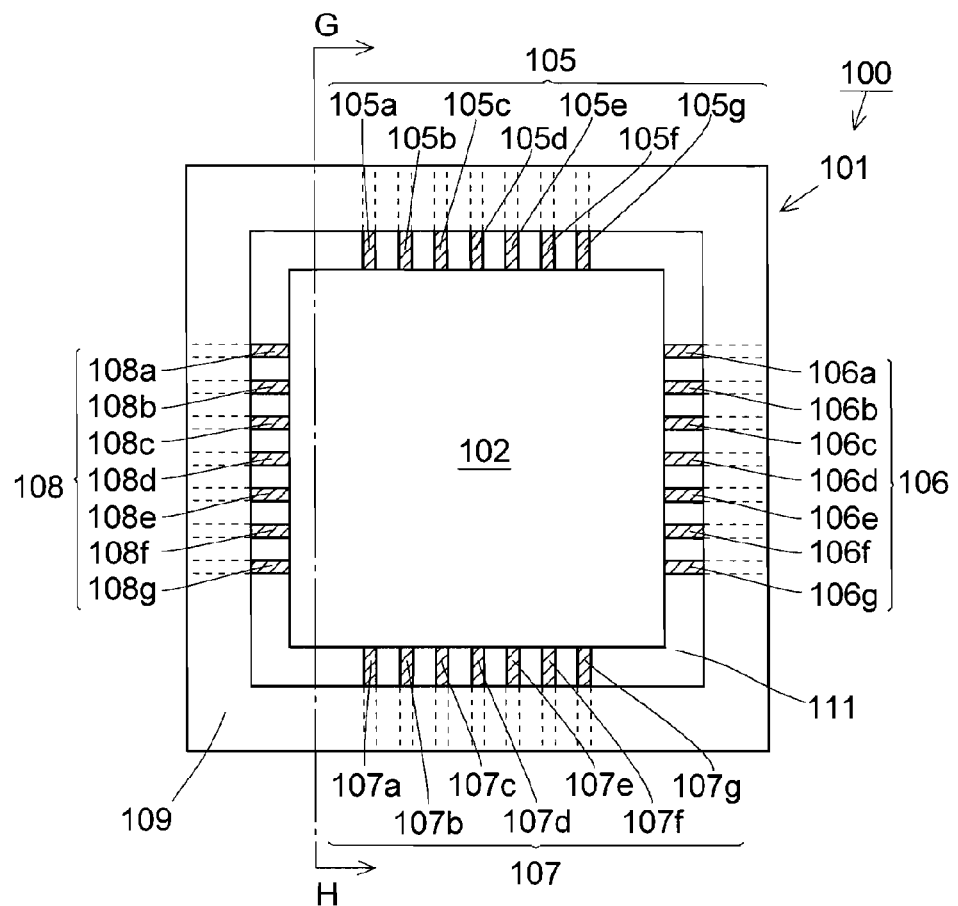
FIG. 8 is an enlarged top view showing part on which an IC chip in a semiconductor device according to a conventional example is placed.
Figure 9:
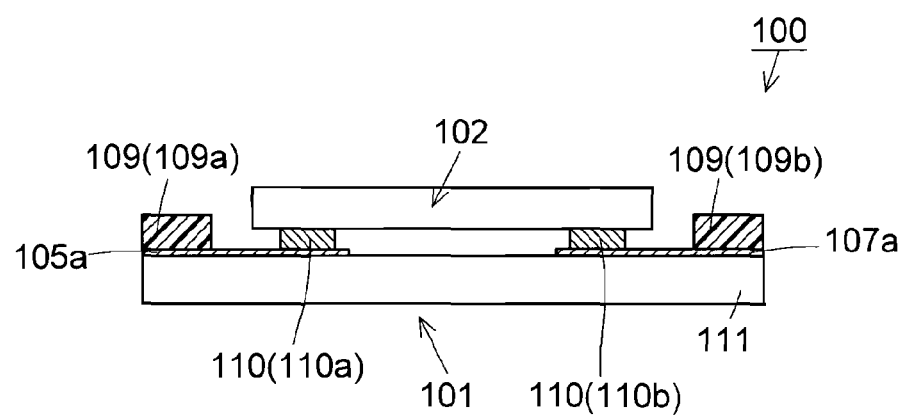
FIG. 9 is a sectional view along a G-H line in FIG. 8.
Figure 10:
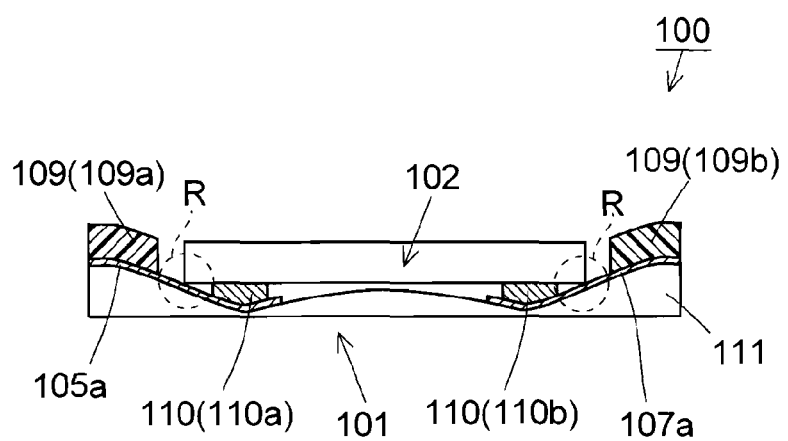
FIG. 10 is a sectional view showing a state in which a substrate is bent in a wiring board according to a conventional example.

The joining between the wiring board 2 and the IC chip 3 having the above structures is described hereinafter. FIG. 5 is a sectional view along a C-D line in FIG. 3; and FIG. 6 is a sectional view along an E-F line in FIG. 3.

As described above, the bumps 18-21 disposed on the IC chip 3 are made to come into contact with the connection terminals 9-12 (see FIG. 3) formed on the wiring board 2, so that the IC chip 3 is electrically connected to the wiring board 2 (wiring layers 5-8) (see FIG. 1). Because of this, for example, as shown in FIG. 5 or 6, if the press process is performed to mount the IC chip 3 on the wiring board 2 by pushing the bump 21 (21a-21g) disposed on the IC chip 3 against the connection terminal 12 (12a-12g) disposed on the wiring board 2, the region of the substrate 4 where the connection terminal 12 is formed sinks downward. Because of this, the IC chip 3 moves toward the wiring board 2 side by the distance by which the substrate 4 sinks. The IC chip 3 moves, so that as shown in FIG. 5, the insulation layer 13 disposed inside the mount region 14 and the four corners of the IC chip 3 come into contact with each other. Because the four corners of the IC chip 3 come into contact with the insulation layer 13, as shown in FIG. 6, for example, it is possible to secure a gap between the wiring layers 5a, 7a disposed on the substrate 4 and the IC chip 3. In other words, it is possible to keep the wiring layers 5a, 7a and the IC chip 3 in a state to be away from each other by a predetermined distance.

Here, even if the substrate 4 is composed of a substrate that has thermal plasticity, the substrate 4 is bent by heat that is applied together with pressure in the press process. However, by employing the above structure, it is possible to keep the state in which the IC chip 3 and the wiring layers 5-8 are away from each other.

Accordingly, according to the present invention, even if the substrate 4 is bent by the press process, by making the IC chip 3 and the insulation layer 13 come into contact with each other, it is possible to keep the wiring layers 5-8 and the IC chip 3 away from each other by the predetermined distance. Because the IC chip 3 is formed of silicon, if the IC chip 3 and the wiring layers 5-8 come into contact with each other, they are electrically connected to each other, so that the circuit short occurs. However, by employing the structure according to the present invention, it is possible to prevent the circuit short between the wiring board 2 and the IC chip 3 and it is possible to prevent the semiconductor device 1 from becoming defective.

Here, in the wiring board 2 according to an embodiment of the present invention, the wiring layers 5-8 and 22 are disposed on both surfaces of the substrate 4; however, they may be disposed on one surface of the substrate 4 and the structure is suitably changed in accordance with the design of the semiconductor device 1. Besides, the wiring board 2 according to an embodiment of the present invention is more suitable for the wiring board 2 in which the wiring layers 5-8 and 22 are formed on both surfaces of the substrate 4, the reason of which is described hereinafter.

By disposing the wiring layers 5-8 and 22 on both surfaces of the substrate 4, because of the space saving, the wiring board 2 allows more components to be mounted, so that more size reduction is possible. Here, as described above, in the wiring layer 22 disposed on the lower surface of the substrate 4, the cover lay film 17, which includes the adhesive layer 15 and the protection layer 16 that are used to protect the wiring layer 22 from outside, is laminated. Because the protection layer 16 is composed of a polyimide film, the protection layer 16 is excellent in flexibility but low in elastic modulus. The protection layer 16 and the adhesive layer 15 both have a thickness of about 25 μm. Because of this, the cover lay film 17 has a thickness of about 50 μm.

Here, because of the above press process, the region of the substrate 4 where the connection terminals 9-12 are formed sinks downward. Because the protection layer 16 and the adhesive layer 15 that constitute the cover lay film 17 which is laminated on the lower surface of the substrate 4, they are low in elastic modulus as a material. Because of this, the distance by which the substrate 4 sinks downward increases by the distance (about 50 μm in the present embodiment), that is, the thickness of the cover lay film 17. In this way, the distance between the wiring layers 5-8 and the IC chip 3 becomes shorter and the wiring layers 5-8 and the IC chip 3 become more likely to come into contact with each other. However, because the wiring board 2 according to an embodiment of the present invention has the structure in which the part of the insulation layer 13 is disposed on the lower surface of the IC chip 3, it is possible to prevent the wiring layers 5-8 disposed on the wiring board 2 and the IC chip 3 from coming into contact with each other by making at least one of the four corners of the IC chip 3 and the insulation layer 13 come into contact with each other.

Besides, in the above embodiment, a protection film (not shown) for protecting a wiring layer (not shown) of the IC chip 3 is formed on the surface of the IC chip 3 that joins the wiring board 2. However, in producing the IC chip 3, in a dicing process in which the IC chip 3 is cut out from a wafer, the protection film disposed on the circumferential region of the IC chip 3 is sometimes cut away. Because of this, the protection film is cut away and silicon of the IC chip 3 is exposed, which causes a problem that the circuit short between the wiring board 2 and the IC chip 3 becomes more likely to occur.

However, by using the wiring board 2 according to an embodiment of the present invention, even in the IC chip 3 whose protection film is cut away, by disposing the insulation layer 13 on at least one of the four corners of the mount region 14, it is possible to protect electrical contact between the wiring board 2 and the IC chip 3 and protect the circuit from shorting. In this way, it is possible to achieve the wiring board 2 that allows the semiconductor device 1 to be easily produced.

Here, the present invention is not limited to the above embodiment; and is suitably applicable to a wiring board in which an insulation layer is disposed inside a mount region where an IC chip is mounted. Besides, the IC chip in the above embodiment is a conception that includes even a chip-like package such as a WLCSP and the like; and instead of the bare chip, a WLCSP may be mounted on the wiring board. Here, in a case where a bump (e.g., a Au bump or a Cu bump) that does not melt in the press process (thermo compression bonding process) is formed on the WLCSP, there is a disadvantage that the WLCSP and the wiring board are likely to electrically come into contact with each other in a time the WLCSP is mounted; however, by composing the wiring board as described above, it becomes possible to effectively prevent the above disadvantage.

The invention claimed is:

1. A wiring board comprising:
   a substrate;
   a wiring layer that is formed on a surface of the substrate and has a predetermined wiring pattern;
   a connection terminal that is formed on part of the wiring layer and electrically connected to a bump electrode of a integrated circuit chip;
   a mount region that is disposed on the surface of the substrate and where the integrated circuit chip is mounted; and
   an insulation layer that protects the wiring layer which is so formed on the surface of the substrate as to surround an outer circumference of the mount region;
   wherein part of the insulation layer is disposed inside the mount region; and
   a thickness of the insulation layer is larger than a thickness of the bump electrode of the integrated circuit chip.

2. The wiring board according to claim 1, wherein the insulation layer disposed inside the mount region is formed away from the connection terminal and the wiring layer.

3. The wiring board according to claim 1, wherein
   the mount region has substantially a rectangular shape when seen in a planar fashion; and
   the insulation layer disposed inside the mount region is disposed on at least one of four corners of the mount region.

4. The wiring board according claim 3, wherein the insulation layer disposed inside the mount region is disposed on the four corners of the mount region.

5. The wiring board according to claim 1, wherein the wiring layer is formed on both surfaces of the substrate.

6. The wiring board according to claim 1, wherein the substrate includes a polyimide film or a polyethylene terephthalate film.

7. A semiconductor device comprising the wiring board according to claim 1.

8. The wiring board according to claim 2, wherein
   the mount region has substantially a rectangular shape when seen in a planar fashion; and
   the insulation layer disposed inside the mount region is disposed on at least one of four corners of the mount region.

9. The wiring board according claim 8, wherein the insulation layer disposed inside the mount region is disposed on the four corners of the mount region.

10. The wiring board according to claim 2, wherein the wiring layer is formed on both surfaces of the substrate.

11. The wiring board according to claim 2, wherein the substrate includes a polyimide film or a polyethylene terephthalate film.

12. A semiconductor device comprising the wiring board according to claim 2.

13. The wiring board according to claim 1, wherein
   the thickness of the insulation layer is smaller than a total thickness of the thickness of the bump electrode and the thickness of the connection terminal.

* * * * *